(12) United States Patent
Abad Molina et al.

(10) Patent No.: US 9,065,465 B2
(45) Date of Patent: Jun. 23, 2015

(54) PLC/WIRELESS DEVICE COORDINATED WIRELESS TRANSMISSIONS

(75) Inventors: Jose Abad Molina, Rincón de la Victoria (ES); Jonathan Ephraim David Hurwitz, Edinburgh (GB)

(73) Assignee: Broadcom Corporation, Irvine, CA (US)

( * ) Notice: Subject to any disclaimer, the term of this patent is extended or adjusted under 35 U.S.C. 154(b) by 56 days.

(21) Appl. No.: 13/432,144

(22) Filed: Mar. 28, 2012

(65) Prior Publication Data

US 2013/0007311 A1 Jan. 3, 2013

Related U.S. Application Data

(60) Provisional application No. 61/503,060, filed on Jun. 30, 2011.

(51) Int. Cl.
| | |
|---|---|
| *G06F 3/00* | (2006.01) |
| *H03M 1/12* | (2006.01) |
| *H04W 36/14* | (2009.01) |
| *H04L 25/02* | (2006.01) |
| *H04W 76/02* | (2009.01) |

(52) U.S. Cl.
CPC .............. *H03M 1/124* (2013.01); *H04W 36/14* (2013.01); *H04W 76/026* (2013.01); *H04L 25/02* (2013.01)

(58) Field of Classification Search
CPC .......................................................... H04B 3/54
USPC .......................................................... 710/29
See application file for complete search history.

(56) References Cited

U.S. PATENT DOCUMENTS

| | | | | |
|---|---|---|---|---|
| 4,072,426 | A * | 2/1978 | Horn .............................. | 356/448 |
| 6,870,515 | B2 * | 3/2005 | Kitchener et al. ............ | 343/853 |
| 7,269,403 | B1 * | 9/2007 | Miao ............................. | 455/402 |
| 2008/0273613 | A1 * | 11/2008 | Kol ................................ | 375/260 |
| 2009/0060060 | A1 * | 3/2009 | Stadelmeier et al. ......... | 375/257 |
| 2010/0061433 | A1 * | 3/2010 | Stadelmeier et al. ......... | 375/222 |
| 2012/0257683 | A1 * | 10/2012 | Schwager et al. ............ | 375/257 |

* cited by examiner

*Primary Examiner* — Titus Wong
(74) *Attorney, Agent, or Firm* — Garlick & Markison; Bruce E. Garlick

(57) ABSTRACT

A Power Line Communications (PLC) device includes a PLC interface, a wireless interface, a processing module, and memory. The PLC device communicates with a second PLC device via the PLC interface to establish a wireless transmission timing base, communicates with the second PLC device via the power mains to coordinate simultaneous wireless data transmissions to a client device from the PLC device and the second PLC device, wirelessly transmits data to the client device based upon the wireless transmission timing base and the coordination with the second PLC device. In combination the PLC devices' simultaneous wireless data transmissions may be Multiple Input Multiple Output (MIMO) transmissions, diversity transmissions, and/or beam formed transmissions. In another operation, the PLC device characterizes its surroundings based upon concurrent directional transmission and receipt of wireless transmissions by the PLC device.

20 Claims, 8 Drawing Sheets

PLC/WIRELESS DEVICE COORDINATED WIRELESS TRANSMISSIONS

CROSS-REFERENCE TO PRIORITY APPLICATION

This application claims priority under 35 U.S.C. §119(e) to U.S. Provisional Application Ser. No. 61/503,060 filed Jun. 30, 2011, which is incorporated herein by reference in its entirety.

BACKGROUND OF THE INVENTION

1. Field of the Invention

The present invention relates to powerline communications and in particular, powerline communication devices, and systems of use therefore.

2. Description of the Related Art

With the growing need for the exchange of digital content (e.g. MP3 audio, MPEG4 video and digital photographs) there is a widely recognized need to improve digital communication systems. Powerline communication (PLC) is a technology that encodes data in a signal and transmits the signal on existing electricity powerlines in a band of frequencies that are not used for supplying electricity. Accordingly, PLC leverages the ubiquity of existing electricity networks to provide extensive network coverage. Furthermore, since PLC enables data to be accessed from conventional power-outlets, no new wiring needs to be installed in a building (or different parts of a building). Accordingly, PLC offers the additional advantage of reduced installation costs.

Communications within a household or within other premises may also be serviced by a Wireless Local Area Network (WLAN), a cellular network, millimeter wave communications, e.g., 60 GHz, Wireless Personal Area Network (WPAN), Cable Modem Network, Local Area Network (LAN), and other communication techniques. Each of these communication types has its respective benefits and shortcomings. None of these communication types is typically able to provide a full coverage solution within the household (or other premises). The shortcoming of all wired technologies is the lack of mobility thereof. Shortcomings of all wireless technologies are coverage holes, which are typical, interference from other wireless devices, including competing wireless devices, Radar, etc., and bandwidth limitations.

DETAILED DESCRIPTION

Figure 1:
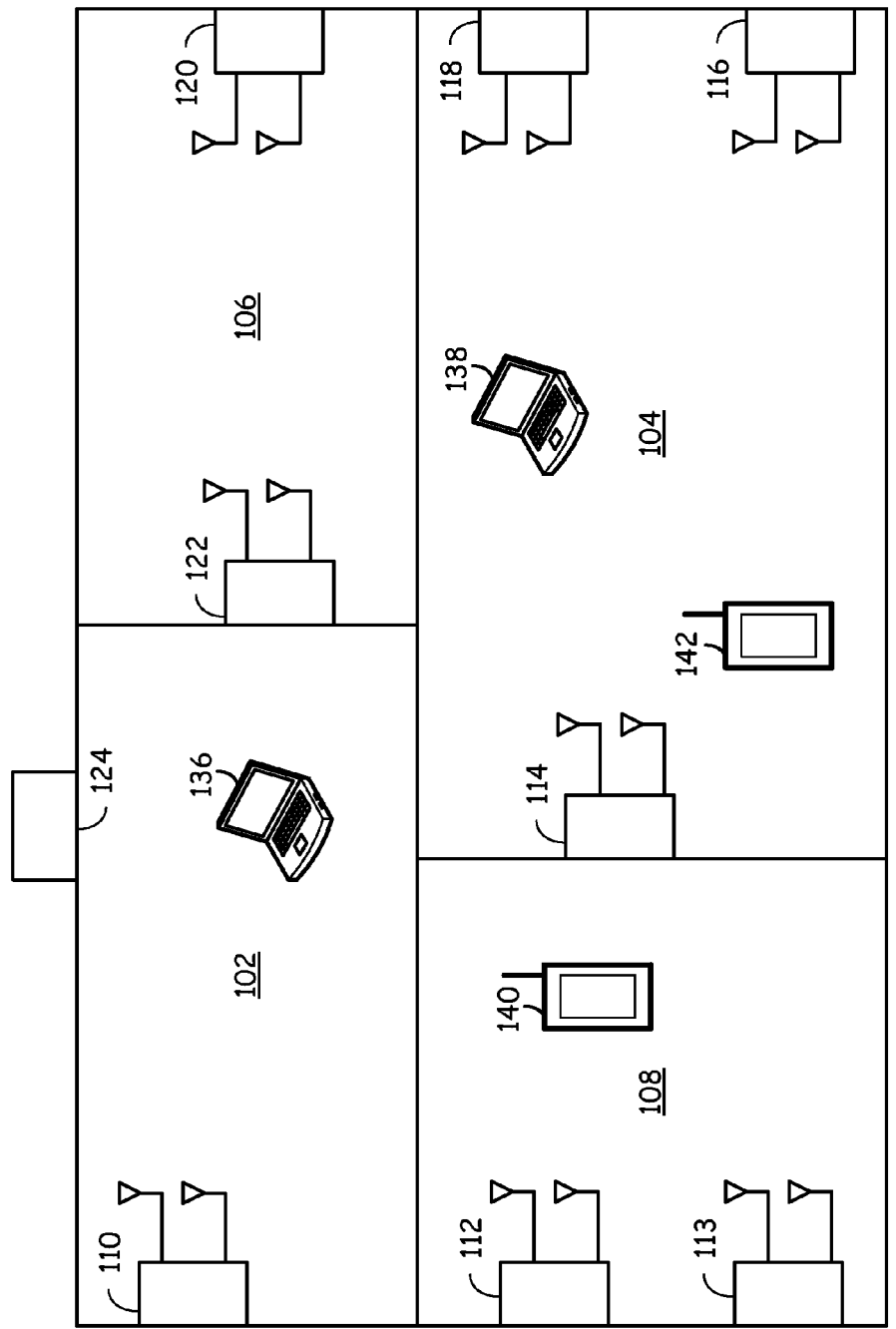
FIG. 1 is a system diagram illustrating a premises in which at least one Powerline Communication (PLC) device resides that operates according to one or more embodiments of the present invention.

FIG. 1 is a system diagram illustrating a premises in which at least one Powerline Communication (PLC) device resides that operates according to one or more embodiments of the present invention. The premises 100 has a distributed mains wiring system (not shown) consisting of one or more ring mains, several stubs and some distribution back to a junction box. In other constructs the distributed mains wiring system has a breaker box with circuits routed there from in a star configuration. For the sake of example, the premises 100 has four areas 102, 104, 106, and 108, e.g., rooms.

Each room 102, 104, 106, and 108 may have a different number of outlets and other power mains connections. Accordingly, there are a variety of distances and paths between different power outlets in the household 100. In particular, the outlets most closely located to each other are those on multi-plug strips, and the outlets furthest away from each other are those on the ends of stubs of different ring mains (e.g. power outlets in the garden shed and the attic). The majority of outlets associated with a particular application (e.g. Home Cinema) are normally located relatively close together.

Installed within the premises 100 are a plurality of PLC devices 110, 112, 113, 114, 116, 118, 120, and 122. Also installed in the premises is a PLC device serving as a Gateway 124 for communications services. Each of these PLC devices also supports one or more of Wireless Local Area Network (WLAN) communications, cellular communications, Wireless Wide Area Network (WWAN) communications, and Millimeter Wave (MMW) communications and is operable to bridge communications from PLC media (power mains) via one or more other interfaces to such communication realms. Each of these PLC devices 110-122 may be enabled to service MIMO wireless communications consistent with IEEE 802.11x, GSM Long Term Evolution (LTE), WiMAX, and/or another wireless standard that supports MIMO and/or MU-MIMO operations. Each of the PLC devices 110-122 illustrated has a structure same or similar to the structure described with reference to FIG. 2 and operates according to the operations described with reference to FIGS. 4-8.

Also located in the premises 100 are a number of client devices 136, 138, 140, and 142, each of which supports wireless operations, MIMO operations in some cases. Each of these client devices 136, 138, 140, and 142 has a structure same or similar as the structure of FIG. 3. Users of these client devices 136, 138, 140, and 142 desire to receive high data rate communication service in each of the spaces 102-108 of the premises. However, based upon the configuration of the spaces 102-108, the location of the PLC devices 110-122, and the locations of the client devices 136-142 within the premises, such desire may not always be met using conventional wireless access points and/or other wireless base station services.

Thus, according to one aspect of the present invention, simultaneous wireless transmissions from a plurality of distinct PLC devices are directed toward one or more client devices 136, 138, 140, and/or 142. Such simultaneous wireless transmissions from the multiple PLC devices, e.g., PLC devices 112 and 113 to client device 140 may be MIMO transmissions, beam formed transmissions, or diversity transmissions, for example. Further, multiple PLC devices, e.g., PLC devices 116, 118, and 114 may simultaneously wirelessly transmit to multiple clients using Multi-User-MIMO (MU-MIMO) communications. These operations will be described further herein with reference to FIGS. 4-5.

In order to synchronize simultaneous wireless transmissions from the multiple PLC devices, wireless transmissions of the PLC devices must be accurately timed with respect to one another, e.g., 1 nanosecond or so difference in timing. In such case, the PLC (or coax) media that couples the PLC devices 110-122 and 124 is employed to establish timing for the PLC devices. These PLC devices 110-122 and 124 are then operated as if they were in a single box to initiate MIMO or beam forming wireless operations to better service wireless communications within the premises 100. These operations will be described further with reference to FIG. 6.

For example, there may be some locations within the premises 100 for which wireless communications cannot be adequately serviced by a single PLC device. In such case, multiple PLC devices that are coupled via powerline or coax are jointly operated to provide beam forming to service such locations. Further, the same technique can be used to service MIMO communications within the premises.

Further, according to another aspect of the present invention, a PLC device that is mounted upon a wall, e.g. PLC device 110, performs operations to determine what type of wall that it mounts upon. In such case, the device may have multiple antennas so as to determine reflection capture for each of a plurality of beam form locations. Based upon the information gathered during a test mode, the device is able to determine the wireless characteristics of the wall upon which it mounts for use in beam forming. Further, feedback may determine that the physical position of the antenna should be adjusted by a user with the device making such determination and requesting that the user adjust the directionality of the antennas correspondingly. These operations will be described further with reference to FIGS. 7-8.

Figure 2:
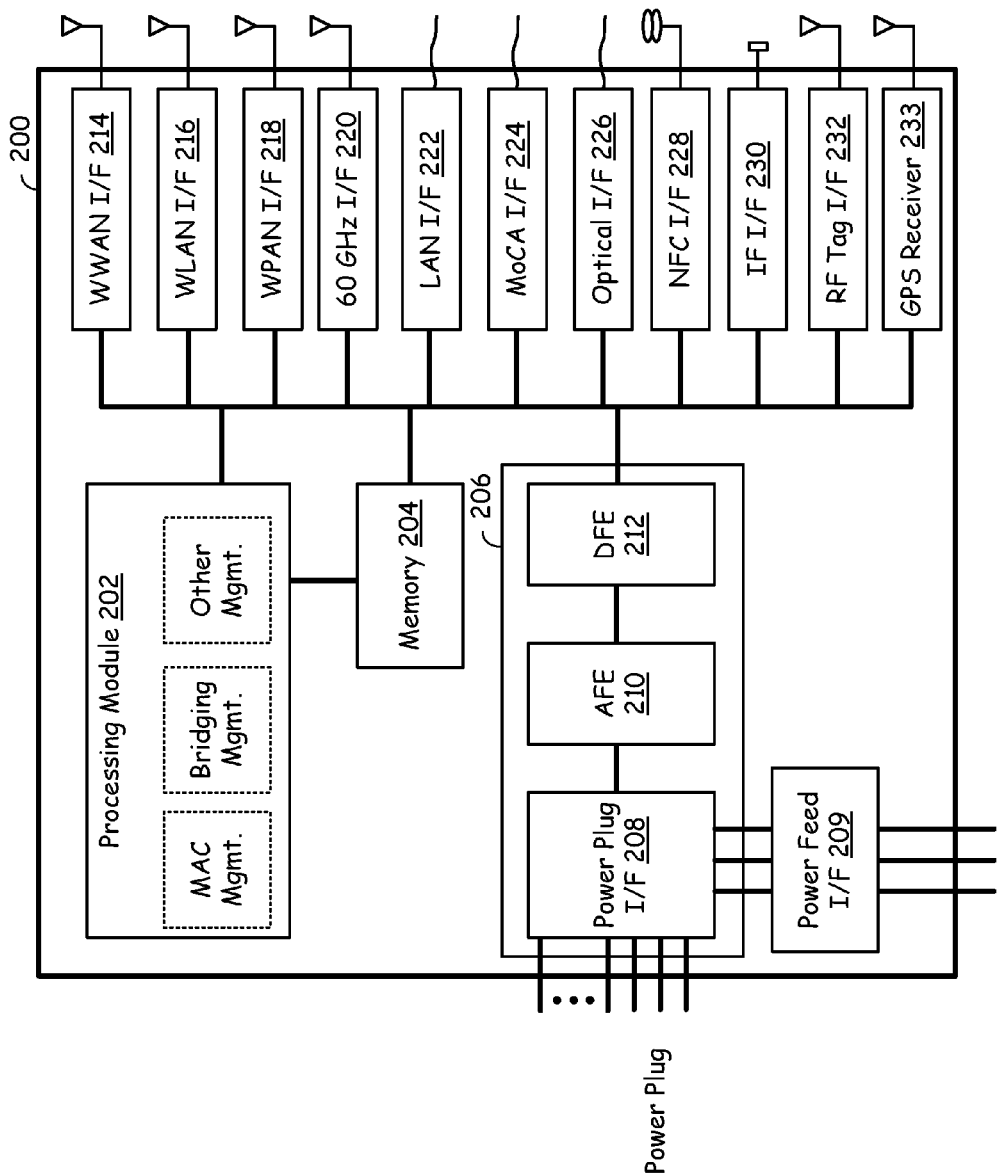
FIG. 2 is a block diagram illustrating a PLC device constructed according to one or more embodiments of the present invention.

FIG. 2 is a block diagram illustrating a PLC device constructed according to one or more embodiments of the present invention. The PLC device 200 supports PLC operations according to one or more PLC communication standards. The PLC device 200 may be coupled to a power plug, e.g., into a wall plug. The PLC device 200 may further include a power feed I/F 209 to provide switchable power to a coupled load device. In some embodiments, the PLC device 200 may be permanently installed within a home or other premises. The PLC device may mount upon a wall, may attach directly to a wall outlet, or may be positioned in a different manner with respect to its surroundings.

The PLC device 200 includes a PLC interface 206 that includes a power plug interface 208, an Analog Front End (AFE) 210, and a Digital Front End (DFE) 212. Generally the AFE 210 includes analog signal processing elements while the DFE 212 includes digital signal processing elements. At least one Analog to Digital Converter (ADC) and at least one Digital to Analog Converter (DAC) service analog to digital and digital to analog signal conversion operations, respectively. Various components of the PLC interface 206 as they relate to embodiments of the present invention will be described further herein.

The PLC device 200 also includes one or more other communication interfaces, including a Wireless Wide Area Network (WWAN) interface 214, e.g., a WiMAX interface, a Wireless Local Area Network (WLAN) interface 216, e.g., an 802.11x interface, a Wireless Personal Area Network (WPAN) interface 218, e.g., a Bluetooth interface, a 60 GHz interface 220 (millimeter wave interface), a Local Area Network (LAN) interface 222, e.g., an Ethernet interface, a cable interface, e.g. Multimedia over Coax Alliance (MoCA) interface 224, an optical interface 226, a Near Field Communication (NFC) I/F 228, an Infra-Red I/F 230, an RF Tag I/F 232, and a GPS receiver 233. The user should appreciate that the PLC device 200 may bridge communications between a power plug and one or more devices, e.g., between the power plug and a desktop computer, a laptop computer, a touchpad computer, an device, a television, another entertainment system device, etc., via the PLC interface 206 and one or more of the other communication interfaces 214, 216, 218, 220, 222, 224, 226, 228, 230, and/or 232. As such, the bridging may be between PLC media and wireless, between PLC media and a wired media, and/or may between wireless and non-PLC media.

The processing module 202 may include one or more of a system processor, a digital signal processor, a processing module, dedicated hardware, an application specific integrated circuit (ASIC), or other circuitry that is capable of executing software instructions and for processing data. In particular, the processing module 202 is operable to support Medium Access Control (MAC) management, communications bridging management, and other management of the communications circuitry of the PLC device 200. The memory 204 may be RAM, ROM, FLASH RAM, FLASH ROM, optical memory, magnetic memory, or other types of memory that is capable of storing data and/or instructions and allowing processing circuitry to access same. The processing module 202 and the memory 204 supports operations of embodiments of the present invention as further described herein. These operations may be embodied in software instructions stored in the memory 204 and executed by the processing module 202. The PLC device 200 of FIG. 2 supports the operations previously described with reference to FIG. 1 and that will be described further with reference to FIG. 4-8.

According to one aspect of the present invention, the PLC device 200 interoperates with another PLC device to simultaneously wireles sly transmit communications to a single wireless device. According to another aspect of the present invention, the PLC device 200 using one or more of its wireless interfaces to sense its wireless propagation surroundings, e.g., determine reflection characteristics/absorption characteristics of a wall upon which it mounts. In such case, the PLC device 200 uses simultaneous transmission and receipt, combined with beamforming in some embodiments.

Figure 3:
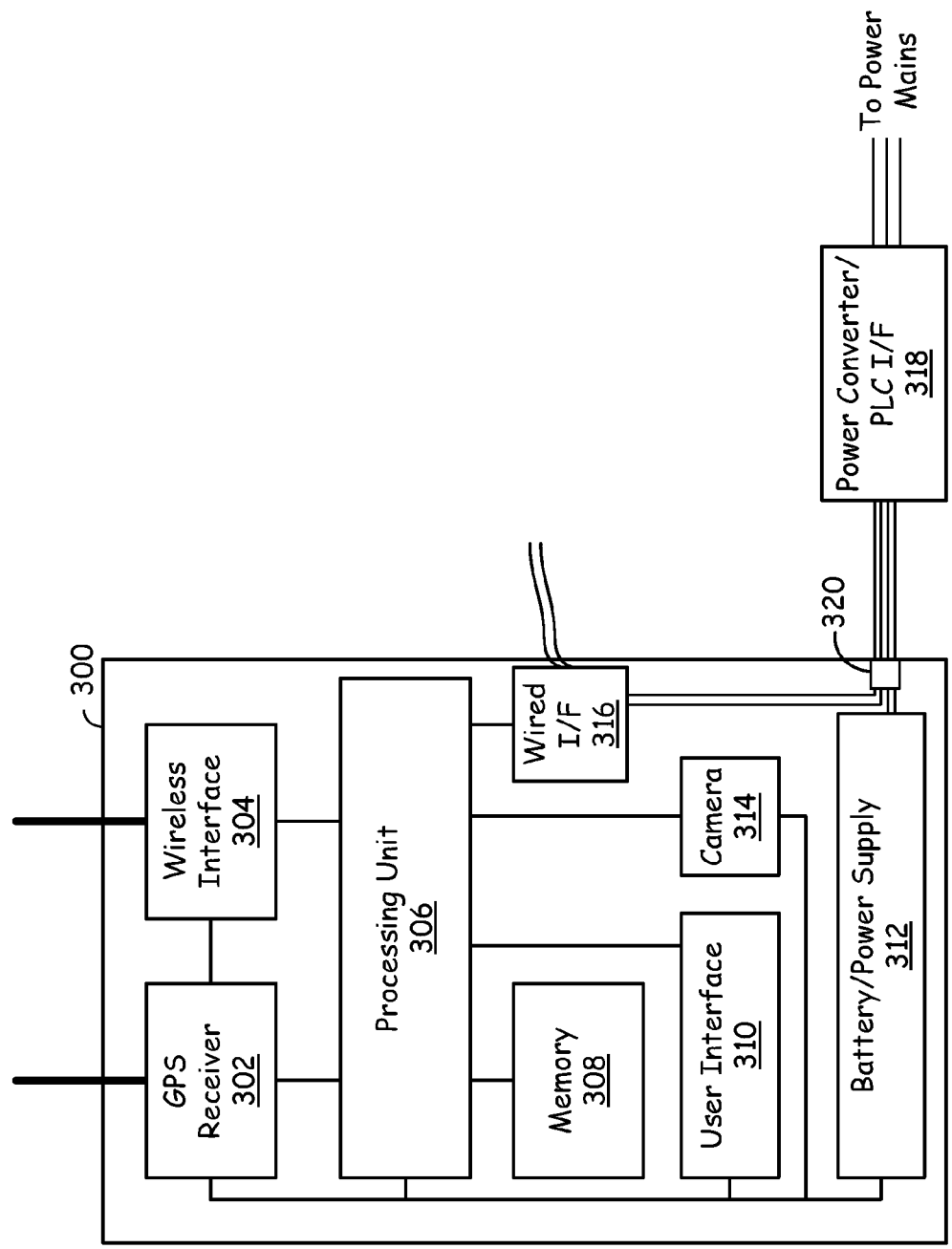
FIG. 3 is a block diagram illustrating a portable electronic device constructed according to the present invention.

FIG. 3 is a block diagram illustrating a portable electronic device constructed according to the present invention. The portable electronic device 300 includes a GPS receiver 302, a wireless interface 304, a processing unit 306, memory 308, user interface 310, a battery/power supply 312, a camera 314, and a wired I/F 316. The components of the portable electronic device 300 are typically contained within a hard case that provides protection from the elements. The wireless interface 304 will have particular structure and functionality based upon the type of the portable electronic device 300. For example, when the portable electronic device 300 is a cellular telephone, the wireless interface 304 will support a corresponding interface standard e.g., GSM, GPRS, EDGE, UMTS, 1xRTT, 1xEV-DO, 1xEV-DV, LTE, etc. The wireless interface 304 of the cellular telephone 304 may also/alternately support WWAN, WLAN, and/or WPAN functionality. When the portable electronic device is a WLAN terminal for example, the wireless interface 304 will support standardized communication according to the IEEE 802.11x group of standards, for example. When the portable electronic device is a WPAN device, the wireless interface 304 supports the Bluetooth interface standard or another WPAN standard. In any case, the wireless interface 304 may support all or a subset of cellular telephone, WLAN, and WPAN operations.

The processing unit 306 may include any type of processor such as a microprocessor, a digital signal processor, an Application Specific Integrated Circuit (ASIC), or a combination of processing type devices. The processing unit 306 is operable to execute a plurality of software instructions that are stored in memory 308 and downloaded for execution. The processing unit 306 may also include specialized hardware required to implement particular aspects of the present invention. Memory 308 may include SRAM, DRAM, PROM, flash RAM, or any other type of memory capable of storing data and instructions.

A user interface 310 may include a microphone, a speaker, a keypad, a screen, a touch screen, a light, a voice recognition system, an optical recognition system that would authenticate a user's iris, for example, and/or any other type of interface that may be employed in the portable electronic device. In some embodiments, the user interface 310 may include therewith ability to service a headset including microphone and earpiece for the user. The wireless device 300 is operable to support the operations described further with reference to FIGS. 4-6.

Figure 4:
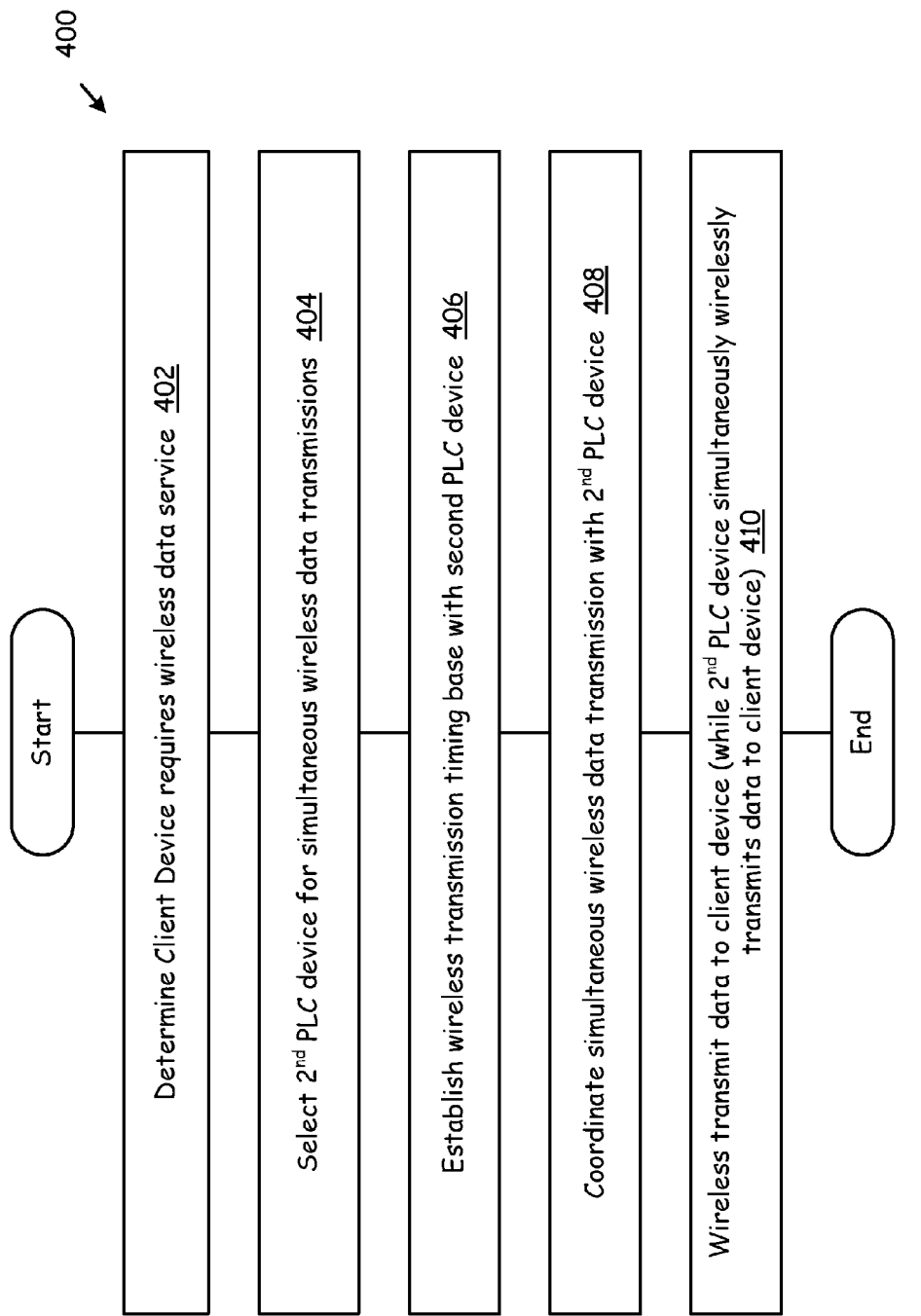
FIG. 4 is a flowchart illustrating operation according to one or more embodiments of the present invention.

The wired I/F 316 may support USB communications, Firewire communications, other serial communications and/or parallel communications. A power converter/PLC I/F 318 is shown to be external to the portable electronic device 300. However, in other embodiments, the power converter/PLC I/F 318 may be internal to the portable electronic device 300. FIG. 4 is a flowchart illustrating operation according to one or more embodiments of the present invention. Operations 400 of FIG. 4 are performed by a PLC device in conjunction with at least one other PLC device, such as one (or more) of the PLC devices 110-122 illustrated in FIG. 1 to provide wireless service to one or more client devices, such as the client devices 136-140 illustrated in FIG. 1.

The operations 400 of FIG. 4 commence with the PLC determining that a client device requires wireless data service (Step 402). Such operation could be accomplished by a client device sending a communication request to a PLC device that provides wireless service within a premises using a known technique, e.g., WLAN service. Operations 400 continue with the PLC device selecting a second PLC device to assist in servicing the client device using simultaneous wireless data transmissions (Step 404). In doing so, the PLC device may communicate with all of the PLC devices in the premises that provide wireless service. In such case, one or more of the other PLC devices may also have received a request from the client device to receive wireless service. With one or more other PLC devices servicing as access points for the client device, a multiple of other PLC devices may have received the wireless service request. With the operation at step 404 of FIG. 4, the PLC device may select a second PLC device that is best suited to service the client device based upon SNR of the client device request, data throughput availability, proximity to the PLC device or client, or upon other criteria. Such selection is based upon communications serviced via the PLC media, e.g., power mains.

After selecting the second PLC device, operations 400 continue with the PLC device establishing a wireless transmission timing base with the second PLC device (Step 406). This coordination is accomplished via the PLC media as well. Such coordination may also be accomplished using the GPS receiver 233 to determine a timing offset between the PLC devices. As should be appreciated, when coordinating transmissions from separate wireless devices to a single client device, simultaneous transmissions must be synchronized in time within a small margin, e.g., a few nanoseconds or less. Thus, the timing of the transmissions between the first and second PLC devices must be done so that the devices can simultaneously transmit to the client device.

The PLC device then communicates with the second PLC device via the PLC interface to coordinate simultaneous wireless data transmission to the client device from a wireless interface of the PLC device and a wireless interface of the second PLC device (Step 408). Such coordination may include determining transmission type, e.g., MIMO, diversity, etc., determining whether same or differing data is transmitted by each PLC device, exchanging directionality parameters for beam forming, refining timing parameters, exchanging pre-coding parameters, exchanging other PHY parameters, and/or exchanging additional parameters required for the simultaneous wireless transmissions.

The PLC device then wireless transmits to the client device while the second PLC device simultaneously wirelessly transmits data to the client device (Step 410). The simultaneous wireless data transmissions may be, in combination, Multiple Input Multiple Output (MIMO) transmissions, diversity transmissions, and/or beam formed transmissions, e.g., PLC devices 112 and 113 transmitting in MIMO format to client device 140, e.g., PLC devices 116 and 118 transmitting in MU-MIMO format to client devices 138 and 142, PLC devices 120 and 110 diversity transmitting to client device 136, etc. The wireless transmissions may be Wireless Local Area Network (WLAN) communications, Wireless Wide Area Network (WWAN) communication, or a Millimeter Wave (MMW) communications in various embodiments. Of course, these transmissions could also be cellular communications.

In any case, the PLC device and the second PLC device wirelessly transmit to the client device as if they were merged into a single device. Such operations provide benefits in multiple ways. First, with differing PLC devices transmitting from differing locations, the quality of the wireless transmissions may be greater by providing better beamforming, better spatial diversity for MIMO/MU-MIMO transmissions, and by avoiding wireless propagation barriers, all to minimize dead spots within a premises as well as increasing serviced data rates within the premises.

Figure 5:
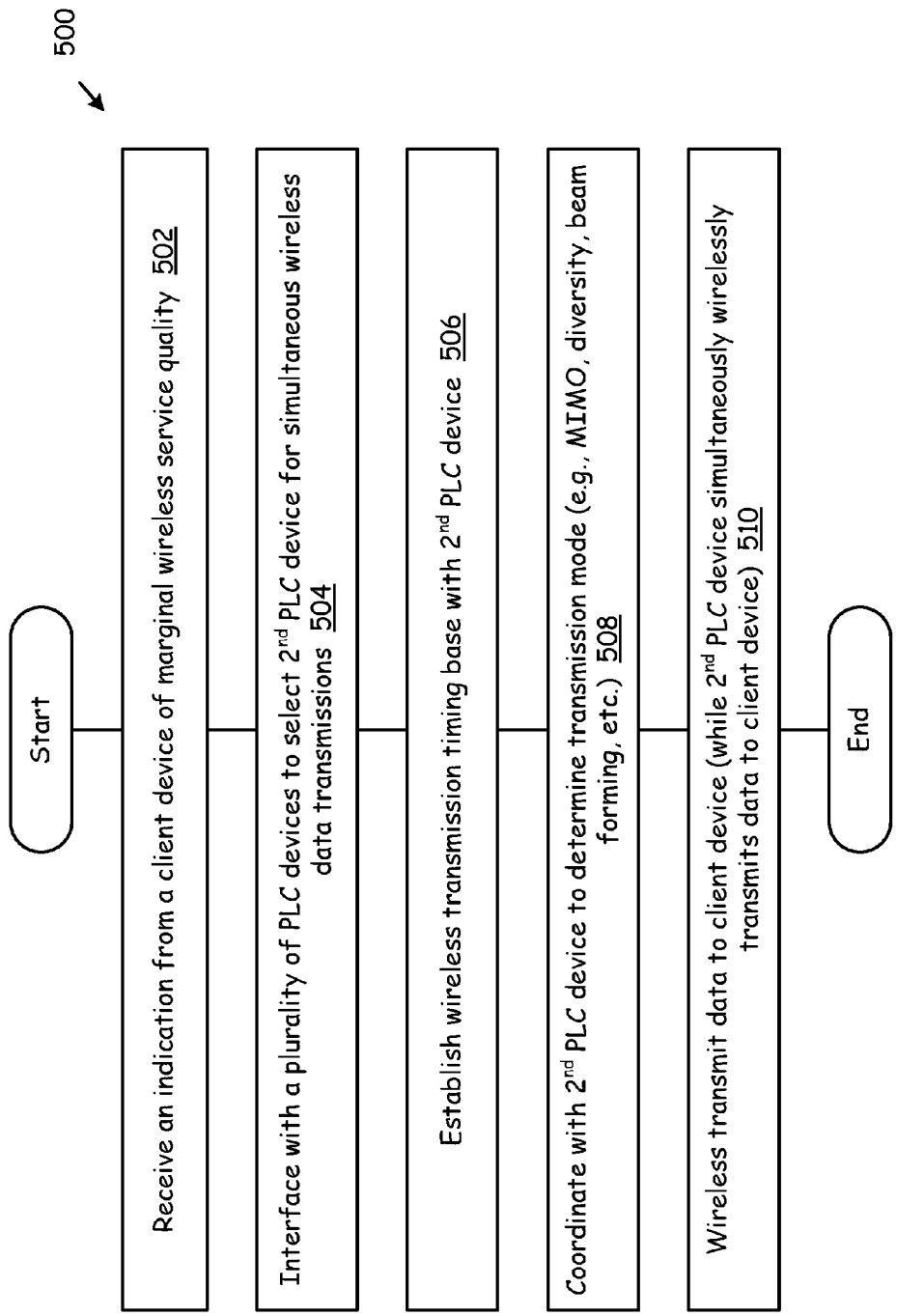
FIG. 5 is a flowchart illustrating operation according to one or more embodiments of the present invention.

FIG. 5 is a flowchart illustrating operation according to one or more embodiments of the present invention. Operations 500 of FIG. 5 are performed by a PLC device in conjunction with at least one other PLC device, such as one (or more) of the PLC devices 110-122 illustrated in FIG. 1 to provide wireless service to one or more client devices, such as the client devices 136-140 illustrated in FIG. 1. Operation commences with a PLC device receiving an indication from a client device that the client device is receiving marginal wireless service quality (Step 502). The poor wireless service quality may be due to the location at which the client device is operating, e.g., within a particular portion of a premises. In any case, the PLC device makes this determination based upon a message receive from the client device, based upon SNR of received signals from the client device, based upon the transmission errors in servicing the client device, or based upon another indication.

After determining that the client device is receiving poor wireless service, the PLC device interfaces with a plurality of other PLC devices servicing wireless communications within the premises to determine which of the other PLC devices would be a good candidate for the $2^{nd}$ PLC device (Step 504). For example, the PLC device may determine a next closest PLC device to the client device based upon Received Signal strength of signals received from the client device, based upon a stored table of available PLC devices, or based upon other information.

The PLC device then establishes a wireless timing base with the selected $2^{nd}$ PLC device via the PLC media (Step 506). One particular technique for establishing such a wireless timing base is described further herein with reference to FIG. 5. After establishing the wireless timing base with the selected $2^{nd}$ PLC device, the PLC device coordinates wireless transmissions with the $2^{nd}$ PLC device to determine a transmission mode (e.g., MIMO, diversity, beam forming, etc.) and the data for transmission to the client device (claim 508). The PLC device then wireless transmits data to the client device while the $2^{nd}$ PLC device simultaneously transmits data to the client device in selected transmission mode (Step 510).

Figure 6:
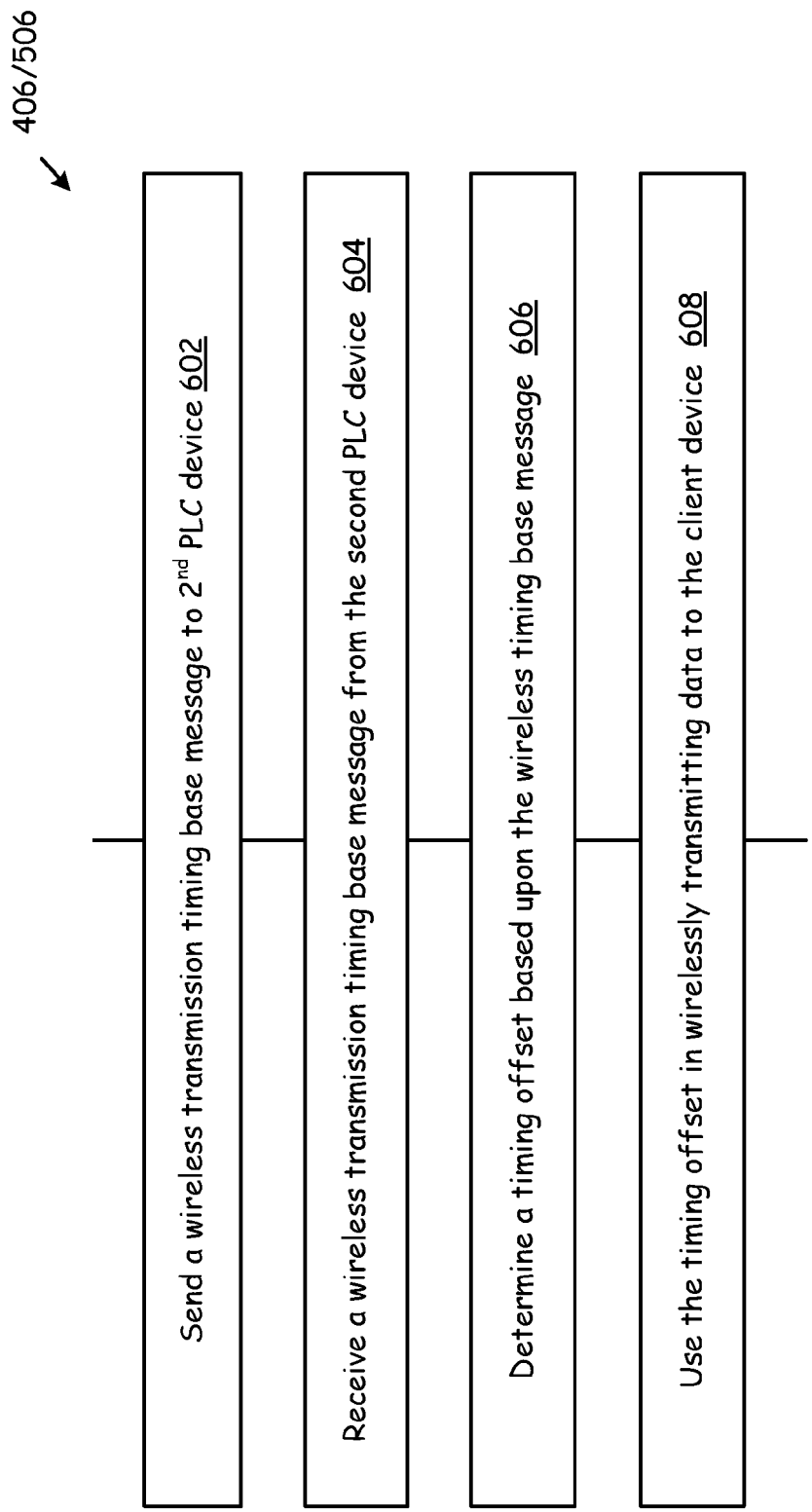
FIG. 6 is a flowchart illustrating operation according to one or more embodiments of the operations of FIGS. 4 and 5.

FIG. 6 is a flowchart illustrating in more detail an embodiment of steps 406 of FIGS. 4 and 506 of FIG. 5 according to one or more embodiments of the present invention. These operations are performed by a PLC device in conjunction with at least one other PLC device, such as one (or more) of the PLC devices 110-122 illustrated in FIG. 1 to establish and use a wireless timing base. The operations of FIG. 6 commence with the PLC device sending a wireless transmission timing base message to the second PLC device (Step 602). Operations continue with the PLC device receiving a wireless transmission timing base message from the second PLC device (Step 604). Operations continue further with the PLC device determining a timing offset based upon the wireless timing base message (Step 606). Finally, operations conclude with the PLC device wirelessly transmitting data to the client device based upon the wireless transmission timing base and the coordination with the second PLC device comprises the PLC device using the timing offset (Step 608).

Figure 7:
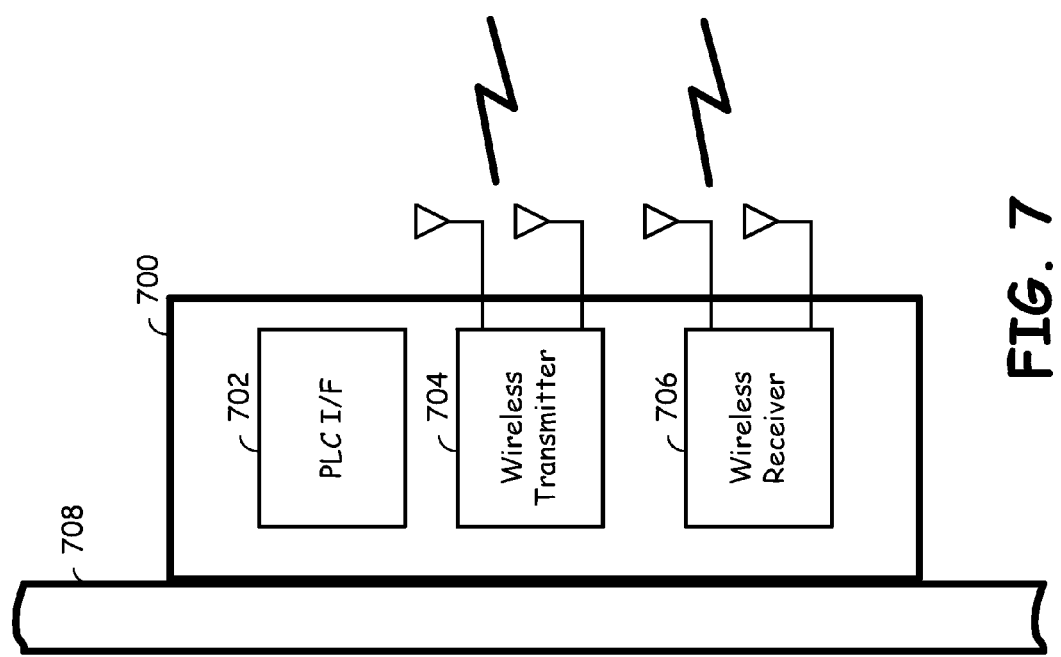
FIG. 7 is a block diagram illustrating a portion of a PLC device constructed and operating according to one or more embodiments of the present invention that is mounted on a wall.

FIG. 7 is a block diagram illustrating a portion of a PLC device constructed and operating according to one or more embodiments of the present invention that is mounted on a wall. The PLC device 700 is mounted upon a wall 708, e.g., coupled directly to a power outlet (not shown), or another surface within a premises. The wall has particular wireless (RF) reflective properties based upon its material content, structure, etc. The PLC I/F 702 of the PLC device 700 couples to a power mains and is communicatively coupled to other PLC devices via the PLC I/F 702.

The PLC device 700 includes a wireless transmitter 704 and a wireless receiver 706, each of which may include multiple antennas, which, in combination may be directionally controlled via respective circuitry. Such directional antenna control allows the wireless transmitter 704 to directionally transmit a transmitted wireless signal, directionality respective to the PLC device 700. Likewise, the wireless receiver 706 has a directionally controlled antenna whose gain may be selectively directed with respect to the PLC device 700. Each of the wireless transmitter 704 and wireless receiver 706 includes at least two antennas to control such directionality. Further, the wireless transmitter 704 and wireless receiver 706 may be WLAN devices, cellular devices, MMW devices, or other wireless devices. The PLC device 700 operates according to at least the operations described with reference to FIG. 8.

Figure 8:
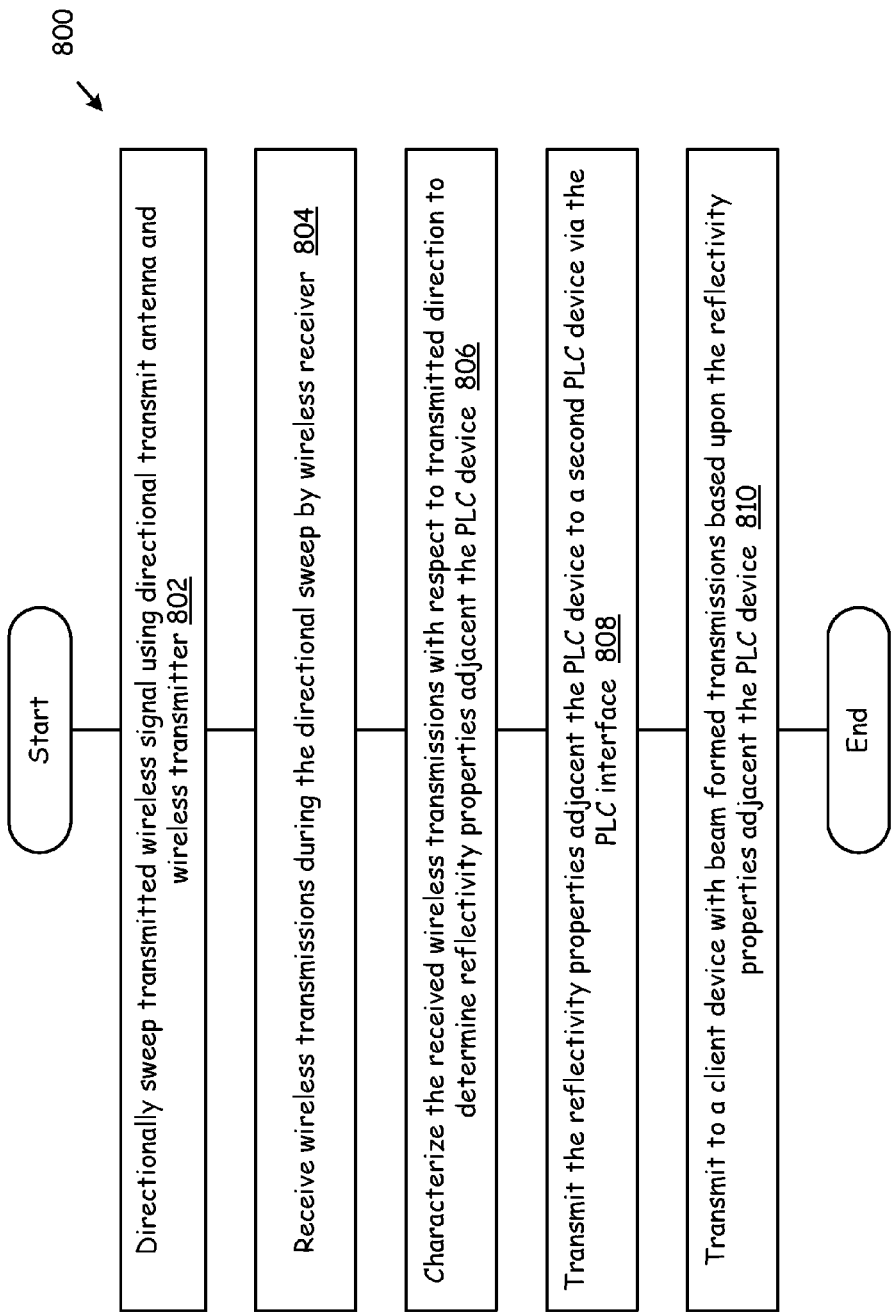
FIG. 8 is a flowchart illustrating operations of the PLC device of FIG. 7 according to one or more embodiments of the present invention.

FIG. 8 is a flowchart illustrating operations of the PLC device of FIG. 7 according to one or more embodiments of the present invention. Operations 800 begin with the PLC device directionally sweep wireless transmissions from the wireless transmitter (Step 802). During such directional sweeping of the wireless transmissions, the wireless receiver receives the wireless transmissions (Step 804). Operations 800 continue with the PLC device characterizing the received wireless transmissions with respect to transmitted direction to determine wireless reflectivity properties adjacent the PLC device (Step 806).

Operations 800 may also include the PLC device communicating the wireless reflectivity properties adjacent the PLC device to a second PLC device via the PLC interface (Step 808). Further, operations 800 may also include the wireless device interacting with the second PLC device to determine a relative position of the second PLC device. Further, the PLC device may be further operable to subsequently transmit to a client device with beam formed transmissions based upon the reflectivity properties adjacent the PLC device (Step 810).

Further still, the operations 800 of the PLC device may include directionally sweeping receive antenna gain direction of the wireless receiver during receipt of wireless transmissions from a second PLC device. Then, the PLC device may characterize the received wireless transmissions from the second PLC device with respect to receive antenna gain direction. Operations 800 may also include the PLC device determining a relative direction to the second PLC device based upon the characterization.

Circuitry described herein that performs particular functions may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions, which may be considered singularly or in combination a "processing module." The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributed located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry including the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the FIGs. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention.

The invention claimed is:

1. A Power Line Communications (PLC) device comprising:
   a PLC interface configured to couple to a power mains;
   a wireless interface;
   a processing module;
   memory coupled to the processing module, wherein the processing module, the PLC interface, and the wireless interface are operable to:
   communicate with a second PLC device via the PLC interface to establish a wireless transmission timing base;
   communicate with the second PLC device via the power mains to coordinate simultaneous wireless data transmissions to a client device from the PLC device and the second PLC device; and
   wirelessly transmit data to the client device based upon the wireless transmission timing base in coordination with the wireless transmission of data from the second PLC device to the client device for simultaneous receipt by the client device.

2. The PLC device of claim 1, wherein the simultaneous wireless data transmissions from the PLC device and the second PLC device are, in combination, Multiple Input Multiple Output (MIMO) transmissions.

3. The PLC device of claim 1, wherein the simultaneous wireless data transmissions from the PLC device and the second PLC device are, in combination, diversity transmissions.

4. The PLC device of claim 1, wherein the simultaneous wireless data transmissions from the PLC device and the second PLC device are, in combination, beam formed transmissions.

5. The PLC device of claim 1, wherein the processing module, the PLC interface, and the wireless interface are operable to:
   determine that the client device is receiving marginal wireless service quality; and
   initiate the simultaneous wireless data transmissions from the PLC device and the second PLC device based upon the indication from the client device.

6. The PLC device of claim 1, wherein the simultaneous wireless data transmissions comprise one of:
   a Wireless Local Area Network (WLAN) communication;
   a Wireless Wide Area Network (WWAN) communication; and
   a Millimeter Wave (MMW) communication.

7. The PLC device of claim 1, wherein in communicating with a second PLC device via the PLC interface to establish a wireless transmission timing base the PLC device is operable to:
   send a wireless transmission timing base message to the second PLC device;
   receive a wireless transmission timing base message from the second PLC device; and determine a timing offset based upon the wireless timing base message, wherein in wirelessly transmitting data to the client device based upon the wireless transmission timing base and the coordination with the second PLC device, the PLC device is operable to use the timing offset.

8. A method for operating a Power Line Communications (PLC) device comprising:
communicating with a second PLC device via a PLC interface to establish a wireless transmission timing base;
communicating with the second PLC device via the PLC interface to coordinate simultaneous wireless data transmission to a client device from a wireless interface of the PLC device and a wireless interface of the second PLC device; and
wirelessly transmitting data to the client device via the wireless interface based upon the wireless transmission timing base in coordination with the wireless transmission of data from the second PLC device to the client device for simultaneous receipt by the client device.

9. The method of claim 8, wherein the simultaneous wireless data transmissions from the PLC device and the second PLC device are, in combination, Multiple Input Multiple Output (MIMO) transmissions.

10. The method of claim 8, wherein the simultaneous wireless data transmissions from the PLC device and the second PLC device are, in combination, diversity transmissions.

11. The method of claim 8, wherein the simultaneous wireless data transmissions from the PLC device and the second PLC device are, in combination, beam formed transmissions.

12. The method of claim 8, further comprising:
determine that the client device is receiving marginal wireless service quality; and
initiating coordinated simultaneous transmissions from the PLC device and the second PLC device based upon the indication from the client device.

13. The method of claim 8, wherein the simultaneous wireless data transmission comprises one of:
a Wireless Local Area Network (WLAN) communication;
a Wireless Wide Area Network (WWAN) communication; and
a Millimeter Wave (MMW) communication.

14. The method of claim 8, wherein in communicating with a second PLC device via the PLC interface to establish a wireless transmission timing base the method comprises:
sending a wireless transmission timing base message to the second PLC device;
receiving a wireless transmission timing base message from the second PLC device; and determining a timing offset based upon the wireless timing base message, wherein wirelessly transmitting data to the client device based upon the wireless transmission timing base and the coordination with the second PLC device comprises the PLC device using the timing offset.

15. A Power Line Communications (PLC) device comprising:
a PLC interface;
a wireless interface having a wireless transmitter and a wireless receiver;
a processing module;
memory coupled to the processing module, wherein the processing module, the PLC interface, and the wireless interface are operable to:
directionally sweep wireless transmissions from the wireless transmitter;
receive the wireless transmissions by the wireless receiver;
characterize the received wireless transmissions with respect to transmitted direction to determine wireless reflectivity properties adjacent the PLC device.

16. The PLC device of claim 15, wherein the processing module, the PLC interface, and the wireless interface are further operable to communicate the wireless reflectivity properties adjacent the PLC device to a second PLC device via the PLC interface.

17. The PLC device of claim 16, wherein the processing module, the PLC interface, and the wireless interface are further operable to interact with the second PLC device to determine a relative position of the second PLC device.

18. The PLC device of claim 15, wherein the processing module, the PLC interface, and the wireless interface are further operable to subsequently transmit to a client device with beam formed transmissions based upon the reflectivity properties adjacent the PLC device.

19. The PLC device of claim 15, wherein the processing module, the PLC interface, and the wireless interface are further operable to:
directionally sweep antenna gain during receipt of wireless transmissions from a second PLC device; and
characterize the received wireless transmissions from the second PLC device with respect to antenna gain.

20. The PLC device of claim 19, wherein the processing module, the PLC interface, and the wireless interface are further operable to determine a relative direction to the second PLC device based upon the characterization.

* * * * *